United States Patent
Tsai et al.

(10) Patent No.: US 9,618,855 B2
(45) Date of Patent: Apr. 11, 2017

(54) LITHOGRAPHY SYSTEM AND METHOD FOR MASK INSPECTION

(71) Applicant: Taiwan Semiconductor Manufacturing Company, Ltd., Hsin-Chu (TW)

(72) Inventors: Fei-Gwo Tsai, Taipei (TW); Bo-Tsun Liu, Taipei (TW); Chieh-Huan Ku, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 287 days.

(21) Appl. No.: 13/763,791

(22) Filed: Feb. 11, 2013

(65) Prior Publication Data

US 2014/0226143 A1 Aug. 14, 2014

(51) Int. Cl.
*G03F 7/20* (2006.01)
*G03F 7/00* (2006.01)
*G03F 1/84* (2012.01)
*G03F 1/82* (2012.01)

(52) U.S. Cl.
CPC ............ *G03F 7/70666* (2013.01); *G03F 1/84* (2013.01); *G03F 7/00* (2013.01); *G03F 7/70483* (2013.01); *G03F 7/70525* (2013.01); *G03F 7/70925* (2013.01); *G03F 1/82* (2013.01)

(58) Field of Classification Search
CPC ...... G03F 1/0092; G03F 7/00; G03F 7/70666; G03F 7/70925; G03F 7/70258; G03F 7/70483; G03F 7/70525; G03F 7/70516; G03F 7/70991
See application file for complete search history.

(56) References Cited

U.S. PATENT DOCUMENTS

| | | | | |
|---|---|---|---|---|
| 5,978,505 | A * | 11/1999 | Sutton et al. | 382/156 |
| 2002/0070355 | A1 * | 6/2002 | Ota | 250/492.2 |
| 2003/0001107 | A1 * | 1/2003 | Kroon | G03F 7/706 250/492.2 |
| 2003/0128870 | A1 * | 7/2003 | Pease et al. | 382/144 |
| 2006/0072086 | A1 * | 4/2006 | Kim | G03B 27/68 355/52 |
| 2006/0273242 | A1 * | 12/2006 | Hunsche et al. | 250/208.1 |
| 2008/0309892 | A1 | 12/2008 | Chen et al. | |
| 2011/0032501 | A1 * | 2/2011 | Fukuhara et al. | 355/67 |
| 2014/0146297 | A1 * | 5/2014 | Vainer et al. | 355/30 |

* cited by examiner

*Primary Examiner* — Michelle M Iacoletti
(74) *Attorney, Agent, or Firm* — Haynes and Boone, LLP

(57) ABSTRACT

The present disclosure provides a method that includes capturing a first image of a mask in a first exposure apparatus using a first exposure source and a first imaging sensor; capturing a second image of the mask in a second exposure apparatus using a second exposure source and a second imaging sensor; comparing the first image of the mask and the second image of the mask for a difference therebetween; and determining an action according to the difference.

11 Claims, 3 Drawing Sheets

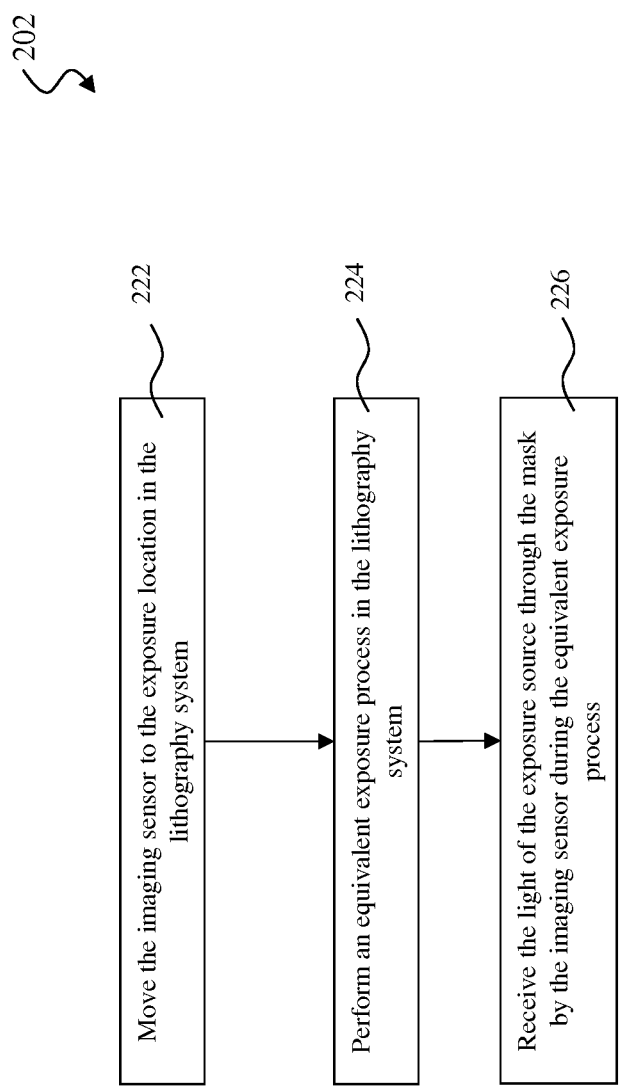

LITHOGRAPHY SYSTEM AND METHOD FOR MASK INSPECTION

BACKGROUND

In semiconductor technologies, a plurality of photomasks (masks) is formed with predesigned integrated circuit (IC) patterns. The plurality of masks is used to transfer those predesigned IC patterns to semiconductor wafers in lithography processes. The predesigned IC patterns formed on masks are master patterns. Any defect on a mask will be transferred to multiple semiconductor wafers and cause yield issues and quality concerns.

The mask defects include mask haze introduced during lithography processes. A wafer patterned with a defected mask may be scraped, increasing the manufacturing cost. To avoid wafer scrape from the mask haze, periodic mask haze inspection is used to periodically check a mask, such as after every few hundreds exposed wafers. This introduces a mask inspection cost and increases the wafer cycle time.

Other issues associated with mask include mask defocus on mask chuck. To avoid wafer scrape from the mask defocus, periodic mask shape measurement is used to check a mask, which introduces a mask shape measurement cost and further increases the wafer cycle time.

Therefore, a system and a method for lithography patterning are needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3 is a flowchart of a method to be implemented in the lithography apparatus of FIG. 1 constructed according to other embodiments.

DETAILED DESCRIPTION

Figure 1:
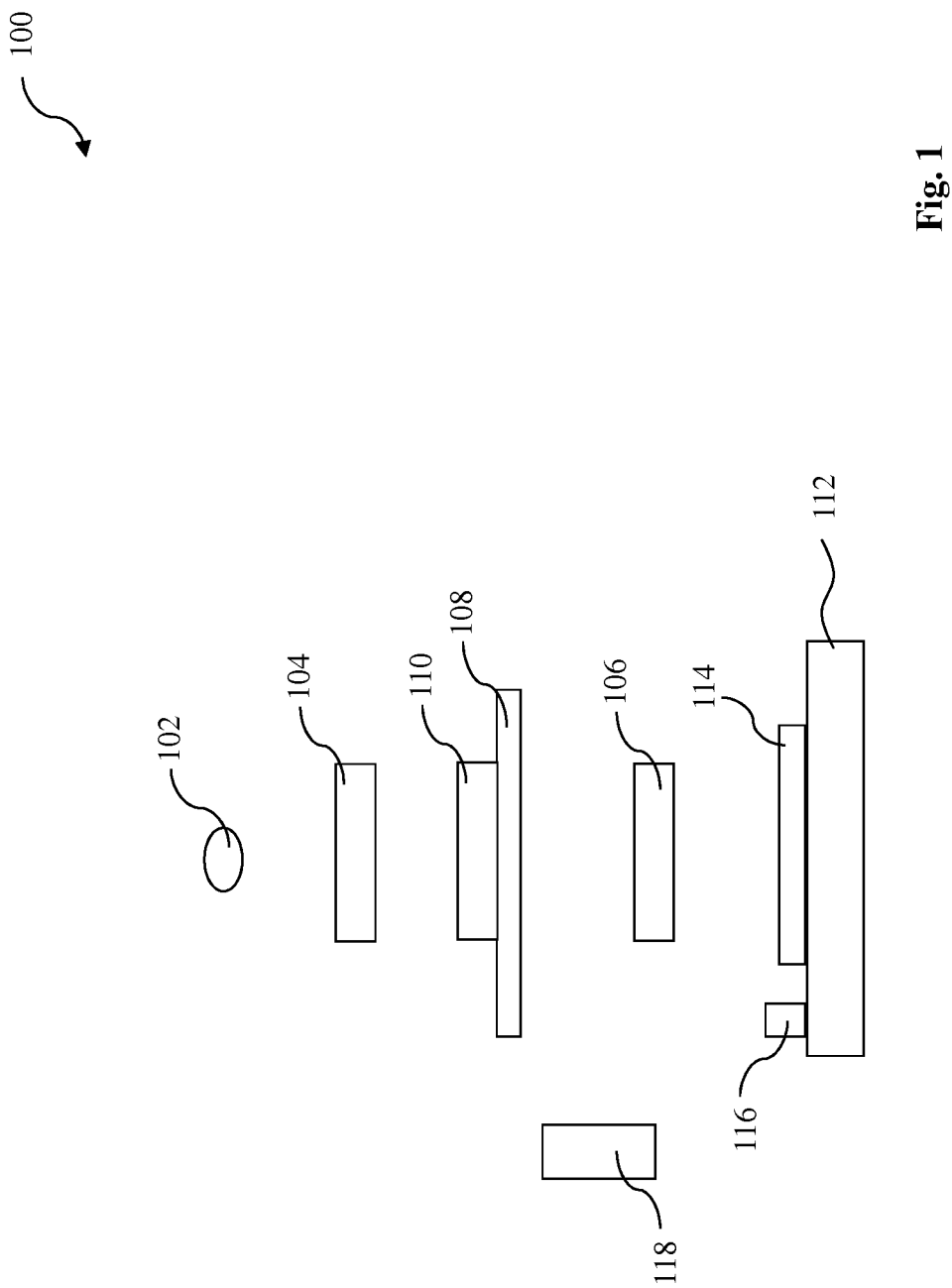
FIG. 1 is a schematic view of a lithography apparatus constructed according to aspects of the present disclosure in one or more embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a schematic view of a lithography system (or an exposure apparatus) 100 constructed according to aspects of the present disclosure in one or more embodiment. With reference to FIG. 1, the system 100 and the method to utilize the same are collectively described.

The lithography system 100 is designed to perform a lithography exposure process in a suitable mode. For example, the lithography system 100 is designed to perform a lithography exposure process in a step-and-scan mode, therefore also referred to as scanner in this case. The lithography system 100 includes an exposure source 102 to provide radiation energy (therefore also referred to as radiation source). The exposure source 102 may be any suitable light source, such as ultraviolet (UV) light. In various examples, the exposure source 102 may include a light source selected from the group consisting of UV source, deep UV (DUV) source, extreme UV (EUV) source, and X-ray source. For example, the exposure source 102 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source is an EUV source having a wavelength of about 13.5 nm or less.

The lithography system 100 includes an optical subsystem that receives the radiation energy from the exposure source 102, modulates the radiation energy by the image of a mask and directs the radiation energy to a resist layer coated on a. In one embodiment, the optical subsystem is designed to have a refractive mechanism. In this situation, the optical subsystem includes various refractive components, such as lenses. In another embodiment where the radiation energy is EUV energy, the optical subsystem is designed to have a reflective mechanism. In this situation, the optical subsystem includes various reflective components, such as mirrors.

In an embodiment, the optical subsystem includes an illumination unit (e.g., a condenser) 104. The illumination unit 104 may include a single lens or a lens module having multiple lenses and/or other lens components. For example, the illumination unit may include microlens arrays, shadow masks, and/or other structures designed to aid in directing radiation energy from the exposure source 102 onto a mask.

The optical subsystem includes a projection unit 106. The projection unit may have a single lens element or a plurality of lens elements configured to provide proper illumination to the resist layer on a wafer. The optical subsystem may further include additional components such as an entrance pupil and an exit pupil to form an image of the mask on the wafer. In another embodiment, the optical subsystem may alternatively include various mirror components to provide a reflective mechanism of imaging.

The lithography system 100 includes a mask stage 108 configured and designed to secure a mask 110 by a clamping mechanism, such as vacuum chuck or e-chuck. The mask stage 108 is further designed to be operable to move for various actions, such as scanning. During a lithography exposing process (or exposure process), the mask 110 is secured on the mask stage 108 and positioned such that an integrated circuit pattern defined thereon is imaged on a resist layer coated on a wafer. In one embodiment, the mask 110 includes a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr). A light beam may be partially or completely blocked when directed on an absorption region. The absorption layer may be patterned to have one or more openings through which a light beam may travel without being absorbed by the absorption layer. The mask may incorporate other resolution enhancement techniques such as phase shift mask (PSM) and/or optical proximity correction (OPC).

In another embodiment where the radiation energy is EUV energy, the mask 110 is designed to have reflective mechanism. The mask includes a substrate coated with a plurality of films to provide a reflective mechanism. For example, the mask includes tens alternating layers of silicon and molybdenum deposited on a substrate to act as a Bragg reflector that maximizes the reflection of EUV light. In one embodiment, the mask further includes an absorption layer, such as a tantalum boron nitride film, patterned to define a layout pattern of an integrated circuit. The mask may further include a capping layer, such as ruthenium, to prevent oxidation.

The lithography system 100 includes a wafer stage 112 that is designed to secure a wafer 114. The wafer stage 112 is further designed to provide various motions, such as transitional motion and rotational motion. In one embodiment, the wafer 114 includes a semiconductor substrate having an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or a combination thereof. In furtherance of the present embodiment, a resist layer is coated on the wafer 114 for the lithography exposing process. The resist layer is resistive to etch and/or ion implantation and is sensitive to the radiation energy.

The wafer 114 includes a plurality of fields having integrated circuits defined therein for one or more dies. During a lithography exposing process, the wafer is exposed one field at a time. For example, the lithography system 100 scans the IC pattern defined in the mask 110 and transfers it to one field, then steps to next field and repeats the scanning until the fields in the wafer 114 are exhausted. Each field includes one or more circuit dies and a frame region at the boundary areas. After the lithography exposure process is applied to the resist layer coated on the wafer 114, the resist layer is further developed by a developing chemical to form a patterned resist layer that have various openings for subsequent semiconductor processing, such as etching or ion implantation.

In one embodiment, the lithography system 100 is designed for immersion lithography. An immersion liquid, such as water, is filled in the space between the projection unit 106 and the wafer stage 112 such that the optical refractive index is increased and the optical resolution of the lithography exposure process is enhanced. In this embodiment, the lithography system 100 may include various components designed and configured to provide, hold and drain the immersion liquid.

The lithography system 100 includes an imaging sensor 116 designed to capture an image of the mask 110. In the present embodiment, the imaging sensor 116 is integrated with the wafer stage 112. In one example, the imaging sensor 116 is secured on the front side of the wafer stage 112 and is positioned to be approximate with the location to hold the wafer 114. The wafer stage 112 is operable to move such that the imaging sensor 116 secured on the wafer stage 112 is located in a position to capture an image of the mask 110 at wafer level. Especially, the image of the mask captured by the imaging sensor 116 is from the same exposure source 102.

The image of the mask at wafer level is an image of the mask (or a portion thereof) projected on the resist layer during the lithography exposure process. However, during a lithography exposure process, the image of the mask is projected on the resist layer of the wafer 114. In an equivalent exposure process, the image of the mask is projected and received by the imaging sensor 116. The equivalent exposure process is similar to the lithography exposure process in term of the exposure source, radiation energy, scan-mode, and imaging mechanism. In the subsequent description, the exposure process applied to the imaging sensor is referred to as equivalent exposure process.

In one embodiment, to capture an image of the mask 110 at the wafer level, the imaging sensor 116 is operated to move relative to the mask 110 in a scan mode such that the image of the mask 110 is received by the imaging sensor 116. The imaging sensor 116 includes an aerial image collecting device using any suitable technology. In one example, the imaging sensor 116 includes charge coupled device (CCD).

In one embodiment, the lithography system 100 also includes an imaging module 118 coupled to the imaging sensor 116 and designed to store and compare images of the mask for mask evaluation, such as mask degradation evaluation or mask defocus evaluation.

The imaging module 118 includes software and hardware designed for image storage and image comparison and image evaluation. In one example, the imaging module 118 includes a media, such as flash memory device or hard disk, to save the mask images from the imaging sensor 116. The mask images may be further labeled and categorized according to the associated masks. In another example, the imaging module 118 includes an algorithm that is able to process a plurality of images associated with one mask, to compare the images for a difference and to evaluate the difference for various mask-related data, such as mask haze contamination and mask defocus issue.

It is understood that the imaging module 118 may be concentrated at a single location or distributed. In one embodiment, the imaging module 118 is embedded in the lithography system 100. In another embodiment, the imaging module 118 is remotely connected to the lithography system 100 through the Internet, intranet or other data communication mechanism. In yet another embodiment, the imaging module 118 is distributed among a plurality of lithography systems and shared by the plurality of lithography systems. In yet another embodiment, the imaging module 118 is a portion of a semiconductor manufacturing and is coupled to the lithography system through a suitable data communication mechanism.

The lithography system 100 is designed to perform lithography exposure process, to capture mask images over time and further to extract mask related information from the mask images. The lithography system 100 may be designed differently according to different characteristics of the imaging sensor 116 and other factors. For example, when the radiation energy is in a certain wavelength range, the imaging sensor 116 is also designed to sensitive to the radiation energy. In another embodiment, the imaging sensor 116 is designed to have an imaging window in a shape such that an instant image of the mask through the scan slot of the optical subsystem is captured.

Figure 2:
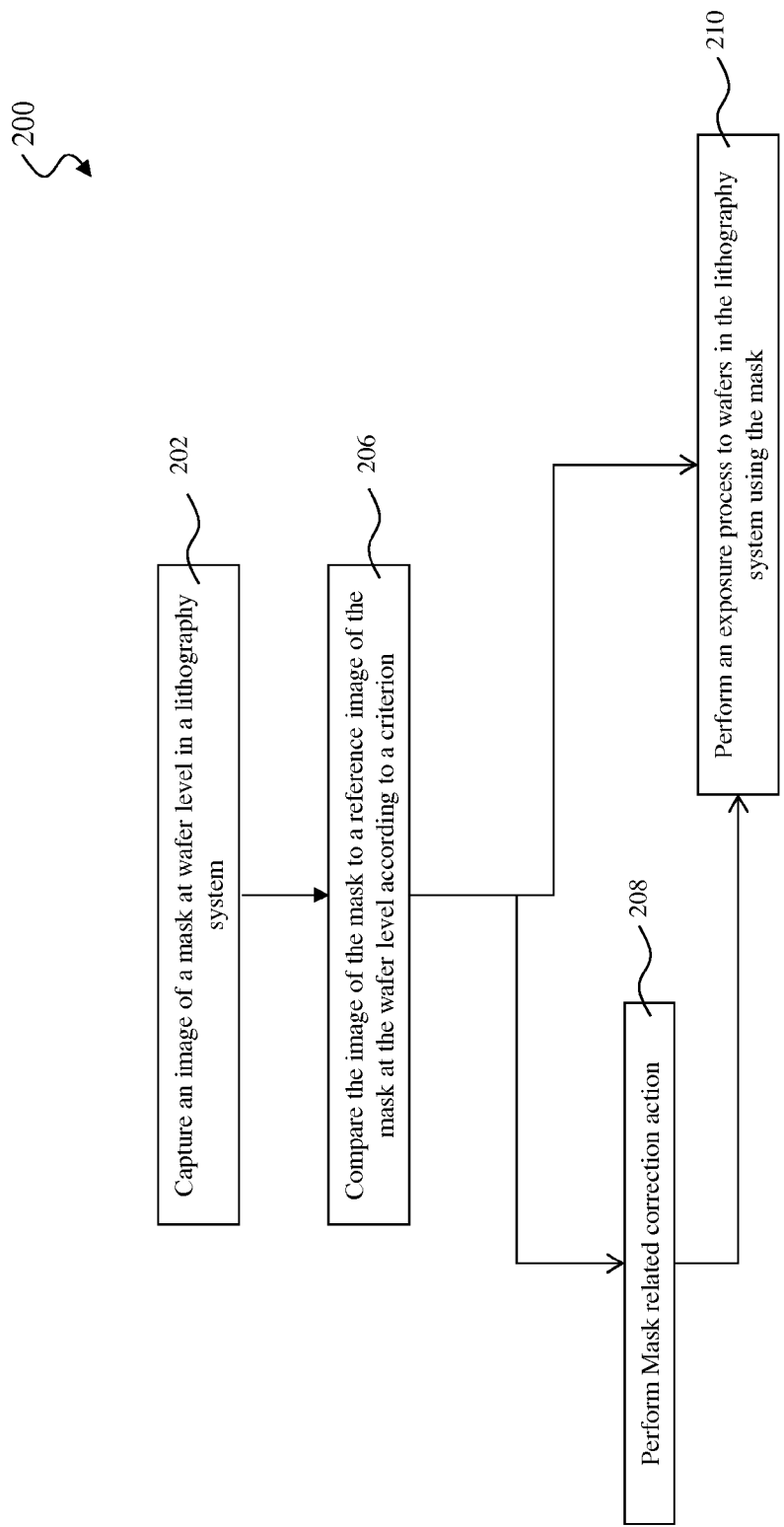
FIG. 2 is a flowchart of a method to be implemented in the lithography apparatus of FIG. 1 constructed according to one or more embodiment.

FIG. 2 is a flowchart of a method 200 to be implemented in the lithography system 100 constructed according to aspects of the present disclosure in one or more embodiment. The method 200 is described with reference to FIGS. 1 and 2.

The method 200 includes an operation 202 to capture an image of the mask 110 using the exposure source 102 and the imaging sensor 116. In the present embodiment, the image of the mask 110 is at wafer level. The image of the mask 110 at wafer level is similar to an image of the mask (or a portion thereof) projected on the resist layer during the lithography exposure process. The difference is that the image of the mask 110 is projected on and captured by the imaging sensor 116 instead of being exposed on and absorbed by the resist layer of the wafer 114. Especially, the image of the mask 110 at wafer level is different from an aerial image of the mask captured by an aerial image measurement system since the aerial image needs to be further converted to an image of the mask at wafer level.

An exposure process is implemented during the operation 202. Since no resist layer is exposed but an image of the mask is captured, the corresponding exposure process is referred to as an equivalent exposure process. During the equivalent exposure process, the radiation energy is directed through the mask 110 and is projected to the wafer stage 112 such that the imaging sensor 116 receives an image of the mask 110. The equivalent exposure process is similar to the lithography exposure process in term of the exposure source and radiation energy.

In the present embodiment of the operation 202, the wafer stage 112 moves relative to the mask 110 to a location so that the imaging sensor 116 is able to receive the radiation energy from the exposure source 102 and capture an image of the mask 110. Thereafter the equivalent exposure process is implemented while the imaging sensor 116 is positioned to receive the image of the mask 110. In furtherance of the embodiment, the equivalent exposure process is performed in a scan mode in which the mask 110 is scanned by the radiation energy from the exposure source 102 such that the image of the mask 110 is received by the imaging sensor 116 through the scanning process. During the scanning process, the mask 110 is moved relative to the wafer stage 112 (therefore relative to the imaging sensor 116), and a portion of the mask 110 (such as a slot portion of the mask 110) is imaged on the imaging sensor 116 at any instant. In one example, the image of the mask 110 received by the imaging sensor 116 includes all circuit features defined in the mask 110.

The operation 202 may be implemented a plurality of times during the lithography patterning processes using the mask 110. In one example, before the use of the mask 110, an initial image of the mask 110 is captured and is saved as a reference image of the mask 110. After a plurality of lithography exposure processes applied to wafers using the mask 110, an image of the mask 110 is captured. In another example, an image of the mask 110 is captured after a certain period of time (such as one day).

The method 200 includes an operation 206 by comparing the image of the mask 110 to the reference image of the mask 110. The mask quality (such as degradation by defect and/or defocus) is evaluated according to the comparison, particularly the difference between the image of the mask 110 and the reference image of the mask 110. It is noted that the comparison is between two physical images of the mask 110 taken at different times instead of simulated images of the mask 110. The evaluation is based on a predefined criterion or multiple criteria. When the difference is beyond (greater than) the criterion (or criteria), the method 200 proceeds to the operation 208. When the difference is within (less than) the criterion (or criteria), the method 200 proceeds to the operation 210. In the present embodiment, the operation 208 is implemented by the imaging module 118.

In one embodiment, the predefined criterion is associated with a statistical parameter. In one example, the statistical parameter is a root mean square of the difference over pixels. Specifically, if $x_i$ represents an intensity difference between the reference image and image of the mask 110 at the pixel "i", the root mean square $X_{rms}=[(x_1^2+x_2^2+ \ldots +X_n^2)/n]^{1/2}$ where n is the total number of pixels in the image of the mask 110. When the parameter $X_{rms}$ is greater than a predefined value (the criterion), the evaluation indicates that the difference is beyond the criterion. When the parameter $X_{rms}$ is less than the criterion, the evaluation indicates that the difference is within the criterion.

In another embodiment, the evaluation is associated with a pattern analysis procedure. During the pattern analysis procedure, when an identified defect has a size greater than a predefined value (criterion), the evaluation indicates that the difference is beyond the criterion. When no identified defect is greater than the predefined value (criterion) in size, the evaluation indicates that the difference is within the criterion.

In another embodiment, the evaluation is associated with a pattern recognition procedure to analyze if the mask 110 has serious mask haze issue or mask defocus issue. When the difference has a certain pattern, a mask defocus issue may be identified accordingly. In this case, the difference is mapped to the predefined pattern to recognize if any mask defocus or what kind of mask defocus issue if any.

The method 200 proceeds to the operation 208 if the difference between the image of the mask 110 and the reference image of the mask is beyond the criterion (or criteria). The operation 208 includes performing a mask related correction action (a fixing action). When the evaluation (including comparison relative to the criterion) indicates that the mask has a serious issue (mask haze or mask defocus), a proper correction action is applied to reduce or eliminate the identified mask issue.

In one embodiment, the correction action includes mask cleaning. When the mask haze defect is identified and evaluated to be beyond the criterion (or criteria) at the operation 206, the mask 110 is cleaned to remove the haze contamination. The mask cleaning includes applying a proper cleaning chemical to clean the mask surface.

In another embodiment, the correction action includes an adjustment or maintenance action to the clamping mechanism (such as vacuum chuck) that holds the mask 110. For example, the vacuum chuck is adjusted to reduce the mask defocus issue.

In another embodiment, the correction action includes a compensation action to reduce the mask defocus issue. For example, the optical module in the lithography system 100 is adjusted to compensate the unbalanced clamping of the vacuum chuck in the mask stage 108 such that the mask defocus issue is reduced or minimized. In another example, a recalibration is implemented to recap the mask image as a reference for the compensation.

The method 200 proceeds to the operation 210 when the difference between the image of the mask 110 and the reference image of the mask is within the criterion (or criteria) or after the operation 208 is implemented. In an alternative embodiment, after the operation 208 is completed, the method 200 may return to the operation 202 and the operation 206 to reevaluate the mask whether the mask-related problem is fixed. If it is fixed, then the method 200 proceeds to the operation 210.

In the operation 210, a lithography exposure process is applied to a wafer to transfer the circuit pattern from the mask 110 to resist layer coated on the wafer. Furthermore, the lithography exposure process is repeated to a number of wafers using the mask 110. Afterward, the method 200 proceeds to the operation 202 to capture another image of the mask 110. The number of wafers may be determined according to the manufacturing data or engineer input. In another embodiment, after a period of time (such as one day) during which a plurality of wafers are exposed using the mask 110, the method 200 returns to the operation 202. By the disclosed method, a plurality of mask images are captured over the lithography processes.

At the operation 210, a lithography exposure process is applied to the resist layer of a wafer secured on the wafer stage 112. In the operation 210, the wafer stage 112 is moved such that the wafer secured on the wafer stage 112 is positioned to be able to receive the radiation energy that is from the exposure source 102 and carries the information of the circuit pattern defined on the mask 110. Thereafter the lithography exposure process is applied to the resist layer of the secured wafer. In one embodiment, the lithography exposure process is performed in a step-and-scan mode in which the mask 110 is scanned by the radiation energy from the exposure source 102 such that the image of the mask 110 is projected to the resist layer of the secured wafer. During the scanning process, the mask moves relatively to the wafer stage 112 (therefore relative to the wafer 114). One field is thus exposed and defined on the resist layer. Thereafter, the mask 110 is stepped to a next field and repeats the scanning process to transfer the image of the mask 110 to the next field. This procedure is continued until the fields in the resist layer are exhausted. In this case, the resist layer includes one image of the mask 110 in each field. In the present embodiment, the lithography exposure process at the operation 210 and the equivalent exposure process at the operation 202 are different in term of exposure mode. The lithography exposure process at the operation 210 is in the step-and-scan mode but the equivalent exposure process at the operation 202 is in the scan mode. That is because that the equivalent exposure process is designed to capture an image of the mask 110. Therefore, the equivalent exposure process takes a time "T" much shorter than that of the lithography exposure process. Assuming that the wafer has "n" fields, the lithography exposure process takes a time about n*T.

The method 200 may have other alternative embodiments without departure from the scope of the present disclosure. In the method 200, a number of mask images in sequence are captured over the time and compare to the reference image for mask evaluation. In one embodiment, various equivalent exposure processes may be implemented in more than one lithography systems similar to the lithography system 100 and the corresponding mask images are captured in the respective lithography systems. For example, the mask 110 is used in a first lithography system and the initial image of the mask 110 is taken in the first lithography system. The mask 110 is transferred to a second lithography system 100 and a second image of the mask 110 is taken in the second lithography system. The initial image is used as a reference. The second image of the mask 110 is compared with the initial image for mask evaluation. In another example, a first subset of the mask images are taken from the first lithography system and a second subset of the mask images are taken from the second lithography system. In this case, the method 200 is more adaptive to the real manufacturing environment for effective and efficient mask monitoring.

In another embodiment, the lithography system 100 may be designed to capture an image of the mask in in-situ with no additional time for capturing a mask image. Specifically, the lithography system 100 is designed to split a small fraction of the radiation energy to the imaging sensor 116 while the most radiation energy is projected to the resist layer of the wafer 114. For example, a proper mechanism (such as a partially reflective mirror) is properly configured in the optical module of the lithography system 100 (such as configured between the mask stage 108 and the projection lens 106) for light splitting. In this case, no equivalent exposure process is needed. During a lithography exposure process to expose the resist layer of a wafer, an image of the mask is simultaneously captured by the imaging sensor 116.

In another example, by comparing the mask images from different lithography systems, it provides a new methodology for lithography tool matching according to the differences of the mask images from the different lithography systems. At the same condition such as before any lithography exposure process, images of the mask are captured from two lithography systems and compared. If the difference is small (according to a criterion), then the two lithography systems are matched for proper manufacturing arrangement, such as used to fabricate wafers of a same product.

In the method 200, a plurality of images of the mask 110 are captured when the mask 110 is in the lithography system 100, the mask inspection time is substantially reduced for various factors. For example, there is no need to take the mask 110 out of the lithography system 100 for mask inspection. Various advantages may present in various embodiments of the disclosed method 200. In one example, various mask issues (such as mask defocus caused by the mask clamping) are effectively identified by the method 200 since the mask inspected (during the equivalent exposure process to capture an image of the mask 110) and the mask used (during the lithography exposure process to expose the resist layer of the wafer 114) are kept in the same mask chuck and at the same clamping status). In another example, the images of the mask 110 are also physical images without any simulated image involved. Thus, any systematic error, such as error from the simulation model is eliminated from the disclosed method.

Even though mask haze is mentioned, the mask defects to be evaluated by the disclosed method are not limited to the mask haze and may further include particles or other mask contamination and degradation. Furthermore, since the mask inspection by the disclosed method and system is more cost effective and efficient, the mask may be monitored and inspected more frequently without substantially increasing the manufacturing cost. For example, capturing a mask image by the disclosed method may be periodically implemented per lot or per wafer.

FIG. 3 is a flowchart of the operation 202 in the method 200 constructed according to aspects of the present disclosure in one embodiment. The operation 202 is further described with reference to FIGS. 1 and 3. The operation 202 includes a step 222 to move the imaging sensor 116 to an exposure location. In the present embodiment, the wafer stage 112 moves relative to the mask 110 to a location so that the imaging sensor 116 is able to receive the radiation energy from the exposure source 102 and capture an image of the mask 110.

The operation 202 includes a step 224 to perform an equivalent exposure process in the lithography system 100. The equivalent exposure process is implemented while the imaging sensor 116 is positioned to receive the image of the mask 110. Furthermore, the equivalent exposure process is performed in a scan mode in which the mask 110 is scanned by the radiation energy from the exposure source 102. During the scanning process, the mask 110 moves relative to the wafer stage 112 (therefore relative to the imaging sensor 116).

The operation 202 also includes a step 226 to receive the light of the exposure source 102 through the mask 110 by the imaging sensor 116. Especially, the step 226 and step 224 are simultaneously implemented. The image of the mask 110 is received by the imaging sensor 116 through the scanning process while the equivalent exposure process is implemented.

Thus, the present disclosure provides one embodiment of a method. The method includes capturing a first image of a mask in an exposure apparatus using an exposure source and an imaging sensor; performing an exposure process to at least one wafer in the exposure apparatus using the exposure source and the mask; capturing a second image of the mask in the exposure apparatus using the exposure source and the imaging sensor; comparing the first image of the mask and the second image of the mask for a difference therebetween; and determining an action according to the difference.

In one embodiment of the method, the determining an action according to the difference includes performing a fixing action if the difference is beyond a predefined criterion. In another embodiment, the performing a fixing action includes cleaning the mask. In another embodiment, the performing a fixing action includes applying a compensation procedure to the exposure apparatus such that the mask degradation is compensated.

In another embodiment, the performing a fixing action includes performing a chuck adjustment to a mask chuck of the exposure apparatus. The mask chuck is configured to secure the mask.

In yet another embodiment, the capturing a first image of a mask using an exposure source and an imaging sensor includes directing light from the exposure source through the mask and toward the imaging sensor integrated with a wafer stage, wherein the exposure source includes an ultraviolet (UV) light source.

In yet another embodiment, the capturing a first image of a mask in an exposure apparatus using an exposure source and an imaging sensor includes moving a wafer stage integrated with the imaging sensor to a first location such that the imaging sensor is able to image the mask; and performing an equivalent exposure process using the mask such that the imaging sensor receives the first image of the mask.

In yet another embodiment, the performing an exposure process to at least one wafer in the exposure apparatus using the exposure source and the mask includes moving the wafer stage to a second location such that the wafer secured on the wafer stage is able to be exposed in a lithography process; and exposing the wafer using the exposure source and the mask.

The present disclosure also provides another embodiment of a method that includes capturing a first image of a mask in a first exposure apparatus using a first exposure source and a first imaging sensor; capturing a second image of the mask in a second exposure apparatus using a second exposure source and a second imaging sensor; comparing the first image of the mask and the second image of the mask for a difference therebetween; and determining an action according to the difference.

The present disclosure also provides yet another embodiment of a method that includes moving a wafer stage integrated with an imaging sensor to a first location such that the imaging sensor is able to image the mask; performing an equivalent exposure process using the mask and an exposure source; capturing an image of the mask at wafer level during the performing an equivalent exposure process; moving the wafer stage to a second location such that a wafer secured on the wafer stage is able to be exposed in a lithography process; and performing an exposure process using the mask and the exposure source such that a resist layer coated on the wafer is lithography exposed.

In one embodiment, the method includes capturing a second image of the mask using the exposure source and the imaging sensor; comparing the first image and the second image for a difference therebetween; and implementing an action according to the difference.

In another embodiment, the method further includes performing a plurality of exposure processes to a plurality of wafers, wherein the capturing a second image of the mask using the exposure source and the imaging sensor is performed after the plurality of exposure processes.

In yet another embodiment, the implementing an action according to the difference includes performing another exposure to another wafer if the difference is within a predefined criterion; and performing a fixing action if the difference is beyond the predefined criterion.

In yet another embodiment, the performing a fixing action is selected from the group consisting of cleaning the mask, exposure apparatus compensation, mask chuck adjustment, and a combination thereof.

In yet another embodiment, the exposure source and wafer stage are integrated in a first exposure apparatus, the method further includes capturing a second image of the mask using another exposure source and another imaging sensor integrated in a second exposure apparatus; comparing the first image and the second image for a difference therebetween; and performing a fixing action if the difference is beyond the predefined criterion.

In yet another embodiment, the capturing an image of the mask at wafer level during the performing an equivalent exposure process includes moving the imaging sensor relative to the mask in a scan mode.

The present disclosure also provides one embodiment of a lithography system that includes an exposure source designed to provide a radiation energy to expose a resist layer coated on a wafer; a mask stage designed to secure a mask having a predefined a circuit pattern defined thereon; a wafer stage configured to secure the wafer and being operational to move; an imaging sensor integrated with the wafer stage and designed to capture an image of the mask at wafer level; and an optical module designed to project radiation energy from the exposure source to the wafer and image the mask on the wafer.

In one embodiment, the imaging sensor includes an aerial image collecting device. In another embodiment, the aerial image collecting device is a charge-coupled device (CCD).

In yet another embodiment, the imaging sensor is configured on a top surface of the wafer stage and is approximate to a location where the wafer is secured.

In yet another embodiment, the lithography system further includes an imaging module coupled to the imaging sensor and designed to store and compare images of the mask for mask degradation evaluation.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method, comprising:
   moving a first wafer stage of a first exposure apparatus to a first location so that a first imaging sensor integrated with the first wafer stage is able to image a mask;
   performing a first exposure process to capture a first physical image of the mask in the first exposure apparatus operating in a first mode using a first exposure source and the first imaging sensor, wherein the first mode is one of a scan mode and a step-and-scan mode;
   moving the first wafer stage to a second location so that a first wafer secured on the first wafer stage adjacent to the first imaging sensor is able to be exposed by a second exposure process;
   performing the second exposure process on the first wafer in the first exposure apparatus operating in a second mode using the first exposure source and the mask, wherein the second mode is the other of the scan mode and the step-and-scan mode;
   moving a second wafer stage of a second exposure apparatus to a third location so that a second imaging sensor integrated with the second wafer stage is able to image the mask;
   performing a third exposure process to capture a second physical image of the mask in the second exposure apparatus operating in the first mode using a second exposure source and the second imaging sensor, wherein the second exposure apparatus is different from the first exposure apparatus, wherein the second exposure source is different from the first exposure source, and wherein the second imaging sensor is different from the first imaging sensor;
   moving the second wafer stage to a fourth location so that a second wafer secured on the second wafer stage adjacent to the second imaging sensor is able to be exposed by a fourth exposure process;
   performing the fourth exposure process to the second wafer in the second exposure apparatus operating in the second mode using the second exposure source and the mask;
   comparing the first physical image of the mask and the second physical image of the mask for a difference therebetween; and
   determining an action according to the difference.

2. The method of claim 1, wherein the performing the first exposure process includes directing light from the first exposure source through the mask and toward the first imaging sensor integrated with the first wafer stage, wherein the first exposure source includes an ultraviolet (UV) light source.

3. The method of claim 1, wherein the determining an action according to the difference further includes determining whether the first exposure apparatus and the second exposure apparatus are matched according to the difference.

4. The method of claim 1, wherein the comparing the first physical image of the mask and the second physical image of the mask for a difference therebetween further includes calculating a root mean square of intensity differences of all pixels of the first physical image of the mask and corresponding pixels of the second physical image of the mask.

5. The method of claim 1, wherein the determining the action according to the difference includes:
   performing a fixing action if the difference is beyond a predefined criterion.

6. The method of claim 5, wherein the performing the fixing action includes adjusting a vacuum chuck.

7. The method of claim 1, wherein the first exposure process takes a first exposure process duration, and wherein the second exposure process takes a second exposure process duration greater than the first exposure process duration.

8. The method of claim 7, wherein the first wafer has a first field number of fields, and wherein the second exposure process duration is equal to about the first exposure process duration times the first field number.

9. The method of claim 1, wherein the first imaging sensor includes an aerial image collecting device.

10. The method of claim 9, wherein the aerial image collecting device is a charge-coupled device (CCD).

11. The method of claim 1, wherein the first physical image of the mask and the second physical image of the mask are generated without using a simulation model.

* * * * *